US009264006B2

(12) United States Patent
Dodd et al.

(10) Patent No.: US 9,264,006 B2
(45) Date of Patent: Feb. 16, 2016

(54) CABLE CONNECTOR HAVING HIGH RESOLUTION ADJUSTABLE CAPACITANCE AND METHOD FOR USING THE SAME

(71) Applicants: Eric E. Dodd, Los Angeles, CA (US); Larry S. Jasper, Los Angeles, CA (US)

(72) Inventors: Eric E. Dodd, Los Angeles, CA (US); Larry S. Jasper, Los Angeles, CA (US)

( * ) Notice: Subject to any disclaimer, the term of this patent is extended or adjusted under 35 U.S.C. 154(b) by 319 days.

(21) Appl. No.: 13/737,827

(22) Filed: Jan. 9, 2013

(65) Prior Publication Data
US 2013/0177172 A1 Jul. 11, 2013

Related U.S. Application Data

(60) Provisional application No. 61/584,678, filed on Jan. 9, 2012.

(51) Int. Cl.
*H03G 5/00* (2006.01)
*H03G 5/02* (2006.01)
*H01B 11/18* (2006.01)
*G10H 1/32* (2006.01)
*G10H 3/18* (2006.01)
*H01R 24/58* (2011.01)
*H01R 13/66* (2006.01)
*H01R 103/00* (2006.01)

(52) U.S. Cl.
CPC . *H03G 5/02* (2013.01); *G10H 1/32* (2013.01); *G10H 3/186* (2013.01); *H01B 11/1895* (2013.01); *H01R 13/6625* (2013.01); *H01R 24/58* (2013.01); *H01R 2103/00* (2013.01)

(58) Field of Classification Search
CPC ........ H03D 1/2227; H04R 27/00; H04R 3/04; H04R 19/04; H04R 5/0335; H04R 11/00; H04R 13/6658

USPC .......... 381/7, 81, 98, 174, 379, 411; 439/620.01

See application file for complete search history.

(56) References Cited

U.S. PATENT DOCUMENTS

| 4,253,057 | A | 2/1981 | Carlton et al. |
| 5,010,802 | A | 4/1991 | Lanham |
| 5,880,921 | A | 3/1999 | Tham et al. |
| 6,285,095 | B1 | 9/2001 | Becker et al. |
| 6,658,119 | B1 * | 12/2003 | Brisson .................. H01B 3/144 330/149 |
| 7,155,382 | B2 | 12/2006 | Boys |

(Continued)

FOREIGN PATENT DOCUMENTS

DE 197 29 039 A1 1/1998

OTHER PUBLICATIONS

Peter D. Hiscocks et al., "Oscilloscope Probes: Theory and Practice," Jul. 12, 2007.

(Continued)

*Primary Examiner* — Akelaw Teshale
(74) *Attorney, Agent, or Firm* — Sheppard, Mullin, Richter & Hampton LLP (57) ABSTRACT

A cable connector configured to receive a sound signal and alter the tonality of the sound by switching among a plurality of capacitors. The cable connector comprises a switch coupled to a binary coded plurality of capacitors. The cable connector receives an input signal corresponding to a sound through a conductor, which is also coupled to the switch. The switch may be used to select one of a plurality of capacitances, affecting the tonality of the sound. A cable implementing the cable connector and a method for using the cable connector are also disclosed.

20 Claims, 6 Drawing Sheets

(56) References Cited

U.S. PATENT DOCUMENTS

| | | | |
|---|---|---|---|
| 7,242,780 B2 | 7/2007 | Brisson et al. | |
| 7,446,258 B1 * | 11/2008 | Sosna | H01B 11/125 174/33 |
| 7,700,872 B2 | 4/2010 | Allen et al. | |
| 8,246,384 B1 * | 8/2012 | Wallace | H01R 24/562 439/620.01 |
| 8,284,962 B2 | 10/2012 | Latshaw | |
| 2007/0238358 A1 | 10/2007 | Akino | |
| 2010/0282046 A1 * | 11/2010 | Crocker | G10H 1/32 84/633 |

OTHER PUBLICATIONS

Moreno Mitchell, "MIT Oracle MA-X Digital AES/EBU," Stereo Times, Apr. 2010.

Neutrik, The New timbrePLUG, http://www.neutrik.com/en/news/the-new-timbreplug.

Neutrik, Assembly Instruction: NP2RX-TIMBRE, Dec. 5, 2010.

* cited by examiner

CABLE CONNECTOR HAVING HIGH RESOLUTION ADJUSTABLE CAPACITANCE AND METHOD FOR USING THE SAME

CROSS-REFERENCE TO RELATED APPLICATION

The present application claims priority to U.S. Provisional Application No. 61/584,678, entitled "Musical Instrument Interconnect Cable," filed on Jan. 9, 2012, the entire contents of which are herein incorporated by reference.

BACKGROUND OF THE INVENTION

The present invention relates generally to an instrument interconnect cable, and more particularly to an instrument interconnect cable wherein the user can adjust the cable's capacitance.

Guitars and other stringed instruments are often amplified by attaching a passive magnetic pickup in close proximity to the vibrating metallic strings of the guitar and connecting this pickup to an amplifier and speaker using a cable. The vibrating strings change the magnetic flux within the core of the pickup. This flux change induces a voltage change in the outer coils of the pickup, thus completing the translation of mechanical vibration to electrical signal. This signal is transmitted through the cable to the amplifier.

The cable connecting the pickup to the amplifier is typically between 5 and 30 feet to allow the musician adequate mobility while playing. The cable typically is terminated on each end with a standard ¼' male connector. Both the guitar and amplifier will typically have the mating female ¼" connector.

Instrument cables are typically of the coaxial type, wherein the signal is surrounded by a 360-degree metallic wire shield. This type of cable protects the very low voltage signal coming from the instrument from radio frequency interference (RFI) or electro-magnetic fields (EMF).

Some musicians have noticed that different brands of instrument cables at different lengths will cause a difference in tonality in an instrument's sound output. One cause for this variance in tonality is the variance in the overall capacitance of the cables being used. Capacitance in cables is caused by the insulating material having a dielectric quality that causes capacitive coupling between the signal wires and the ground, or shield, wires. Coaxial cables are typically given a capacitance per foot rating (pF/ft). This rating typically can be anywhere from 10 pF/ft to 50 pF/ft. By multiplying the pF/ft rating by the length of the cable, a person can calculate the overall capacitance of a particular length of a particular cable. The overall capacitance of a cable typically ranges from 300 pF to 1200 pF. Cables of different capacitances will have different tonal qualities when used with an instrument having passive magnetic pickups.

With present cables, musicians are able to vary the capacitance only by using different cables of different lengths. This is inconvenient for several reasons. First, if a musician wants to produce the same tonality from his or her instrument, then he or she must use the same cable with the same length all the time, or the musician must try to find two or three cables of different lengths that have the same capacitance, exchanging one for the other whenever a cable of a different length is needed. Additionally, if a musician would like to take advantage of the different tonalities offered by cables having different capacitances, then he or she must undertake the inconvenient process of unplugging one cable and then plugging in another having a different capacitance to replace it. The current options available for addressing this issue do not offer a sufficient range of adjustment for altering the capacitance.

It can readily be appreciated that there is a need for an instrument cable that avoids the problems described above. The present invention fulfills this need and provides further related advantages.

SUMMARY OF THE INVENTION

The present invention is embodied in a cable connector comprising a switch, a plurality of capacitors each coupled to the switch, and a conductor coupled to the switch. The capacitance of the connector can be changed by switching among the capacitors using the switch. The conductor is configured to receive an input signal corresponding to a sound, and the tonality of the sound is altered by changing the capacitance of the connector.

In one embodiment, the cable connector connects to an instrument cable.

The switch may be implemented in a variety of ways, and may comprise any of the following: a rotary binary coded switch, a plurality of individual switches, a plurality of transistors, or a plurality of buttons.

In one embodiment, the conductor receives an input signal created by an instrument. The input signal may be created by a passive magnetic pickup on the instrument.

In a particular embodiment, if there are "n" number of capacitors, the switch may be configured such that the capacitance of the connector can be changed to one of $2^n$ possible capacitances by switching among the capacitors or combinations of capacitors using the switch. Alternatively, if there are "n" number of capacitors, the switch may be configured such that the capacitance of the connector can be changed to one of $2^n-1$ possible capacitances by switching among the capacitors or combinations of capacitors using the switch.

The present invention is also embodied in a cable comprising an input connector, a switch, and a plurality of capacitors each coupled to the switch. The cable has a capacitance that can be changed by switching among the capacitors using the switch. The input connector is configured to receive an input signal corresponding to a sound, and the tonality of the sound can be altered by changing the capacitance of the cable.

In one embodiment, the cable receives an input signal created by an instrument. The input signal may be created by a passive magnetic pickup on the instrument.

In a particular embodiment, if there are "n" number of capacitors, the switch may be configured such that the capacitance of the cable can be changed to one of $2^n$ possible capacitances by switching among the capacitors or combinations of capacitors using the switch. Alternatively, if there are "n" number of capacitors, the switch may be configured such that the capacitance of the cable can be changed to one of $2^n-1$ possible capacitances by switching among the capacitors or combinations of capacitors using the switch.

The present invention is also embodied in a method for transmitting a sound signal, the method comprising selecting one of a plurality of capacitance options using a switch, receiving a signal corresponding to a sound having a tonality, and altering the tonality of the sound by applying a selected one of the plurality of capacitance options.

In one embodiment, the received signal is created by an instrument. The signal may be created by a passive magnetic pickup on the instrument.

In a particular embodiment, if there are "n" number of capacitors, the switch may be configured such that the selected capacitance can be changed to one of $2^n$ possible capacitances by switching among the capacitors or combinations of capacitors using the switch. Alternatively, if there are "n" number of capacitors, the switch may be configured such that the selected capacitance can be changed to one of $2^n-1$ possible capacitances by switching among the capacitors or combinations of capacitors using the switch.

These and other features and advantages of the invention should become more readily apparent from the detailed description of the preferred embodiments set forth below taken in conjunction with the accompanying drawings, which illustrate, by way of example, the principles of the invention.

BRIEF DESCRIPTION OF THE DRAWINGS

Embodiments of the present invention will now be described, by way of example only, with reference to the following drawings.

DETAILED DESCRIPTION OF THE PREFERRED EMBODIMENTS

Figure 1:
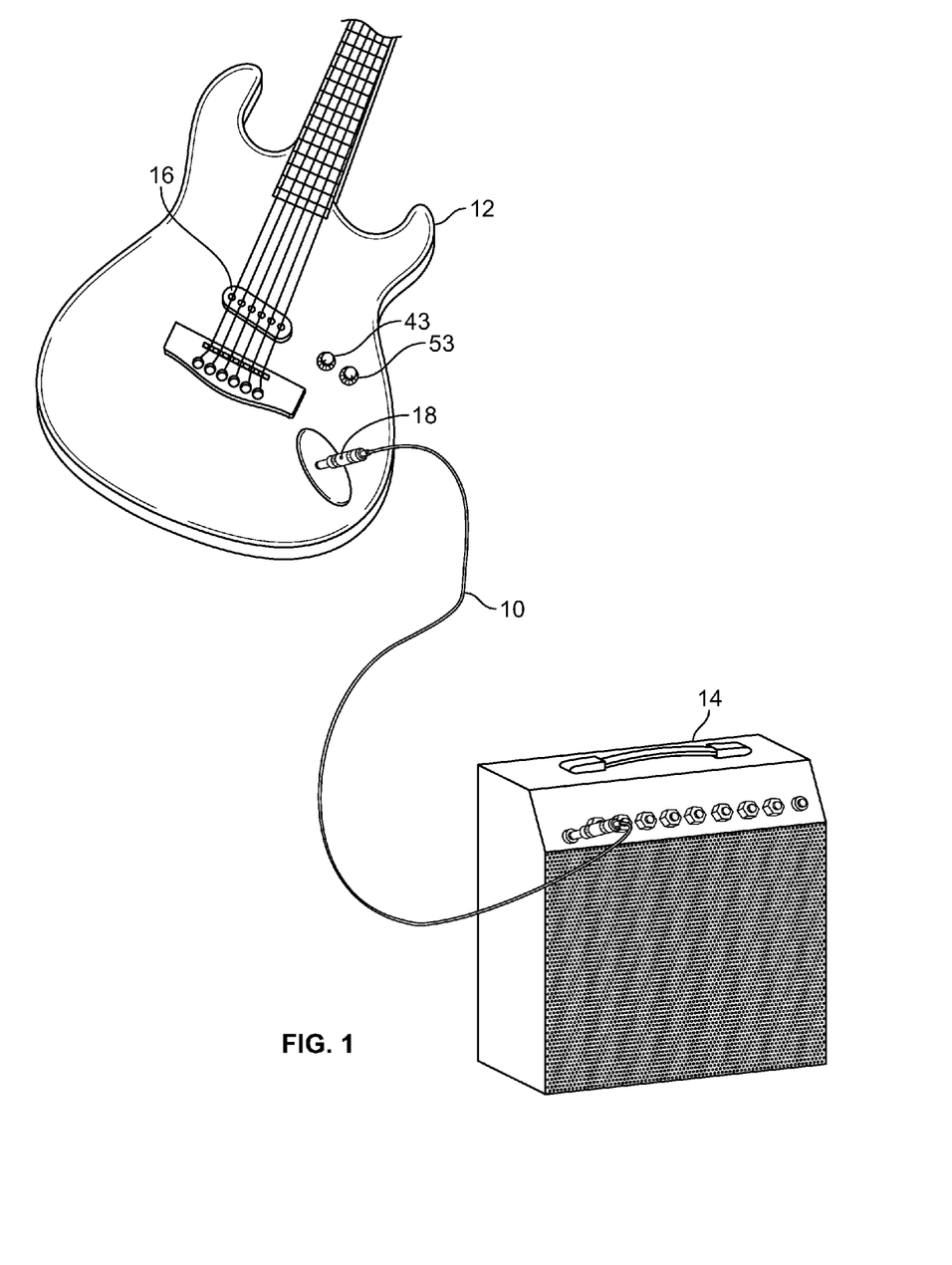
FIG. 1 is a perspective view of an instrument, an amplifier, and an instrument cable having adjustable capacitance, in accordance with an embodiment of the present invention.

With reference to the drawings, and in particular to FIG. 1 thereof, there is shown an instrument, an amplifier, and an instrument cable 10 in accordance with an embodiment of the present invention. One end of the instrument cable 10 is connected to the instrument 12, in this case an electric guitar, and the other end of the instrument cable 10 is connected to the amplifier 14. The instrument cable 10 is connected to the guitar 12 at a point removed from the playing area. Internal cables (not shown) connect the instrument cable 10 internally to a passive magnetic pickup 16 on the guitar 12. When played, the vibrating strings on the guitar 12 induce voltage changes in the outer coils of the pickup 16, thus completing the translation of a mechanical vibration to an electrical signal. This electrical signal is transmitted through the cable 10 to the amplifier 14.

In one embodiment, the instrument cable 10 is between 5 and 30 feet to allow the musician adequate mobility while playing. The cable is terminated on each end with a standard ¼" male connector. Both the guitar 12 and the amplifier 14 have the mating female ¼" connector. The instrument cable 10 is of the coaxial type, wherein the signal is surrounded by a 360-degree metallic wire shield. This type of cable protects the very low voltage signal coming from the instrument from radio frequency interference (RFI) or electro-magnetic fields (EMF). The instrument cable 10 includes a rotary switch 18 that can be used to adjust the capacitance of the cable so as to adjust the tonality of the sound produced.

Figure 2:
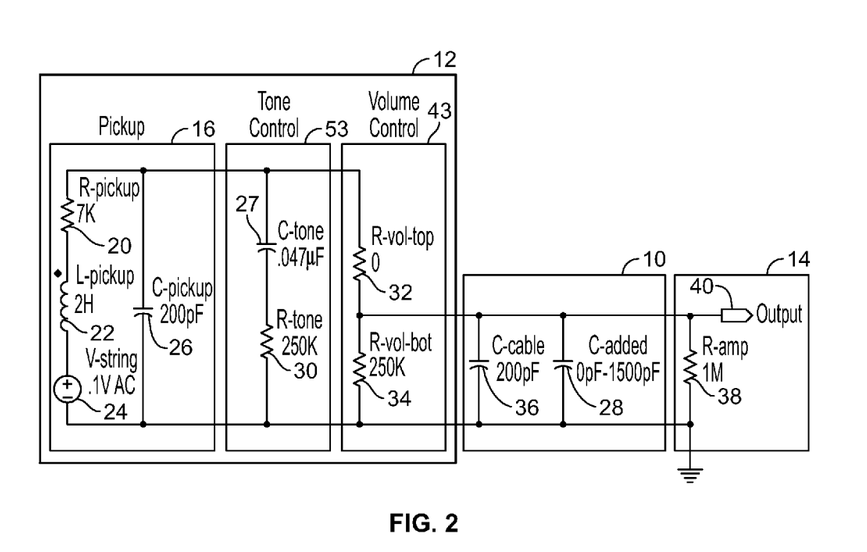
FIG. 2 is a circuit diagram representing an instrument, amplifier, and instrument cable, in accordance with an embodiment of the present invention.

With reference to FIG. 2, there is shown a circuit diagram representing a guitar 12, an amplifier 14, and an instrument cable 10, in accordance with an embodiment of the present invention. The guitar 12 includes a guitar pickup 16, a "tone control" 53, and a "volume control" 43. The guitar pickup 16 is represented by a pickup resistance 20, a pickup inductance 22, a string voltage 24, and a pickup capacitance 26. The instrument cable 10 is represented by a cable capacitance 36 and an added capacitance 28. Vibrations in the strings of the guitar cause the pickup 16 to register voltage changes at the string 24. The voltage changes create an electrical sound signal that passes to and through the cable 10. As the sound signal passes through the cable 10, it is affected by the cable capacitance 36 and the added capacitance 28 on its way to the amplifier 14. The cable capacitance 36 is not a discrete capacitor, but instead an inherent capacitance that is caused by the cable's insulating material having a dielectric quality, which causes capacitive coupling between the signal wires and the ground/shield wires, as described above. As such, traditional cables contain an inherent cable capacitance 36, but do not have the "added capacitance" 28, which is added in the present invention so as to give the user greater control over the sound produced. The guitar's tone control 53 also includes a variable capacitance, C-tone 27. For the present invention, it is preferable for the tone control capacitance 27 to be set to its lowest possible capacitance, so that it has little to no effect on the produced sound. The cable 10 outputs a sound signal to the amplifier 14 at the output 40.

When the tone capacitance 27 is set to its lowest capacitance setting, as discussed above, the minimum capacitance of the entire system is essentially equal to the sum of the cable capacitance 36 and the pickup capacitance 26 (26+36). In a traditional instrument cable, the tonality created by the instrument cable depends mostly on the interaction of the pickup inductance 22 and this minimum capacitance. In the instrument cable of the present invention, this minimum capacitance is augmented by the added capacitance 28. This then results in a "total capacitance" (26+36+28). A resonant frequency is created where the reactance of the total capacitance (26+36+28) and pickup inductance 22 are equivalent in magnitude. The resonant frequency of the circuit in FIG. 2 is calculated by using the equation:

$$f_r = \frac{1}{2\pi\sqrt{LC}},$$

where L is the fixed pickup inductance 22 and C is the total capacitance (26+36+28), which is determined by adding the cable capacitance 36, the pickup capacitance 26 and the added capacitance 28. Changes to the resonant frequency affect the tonality of a sound by emphasizing or de-emphasizing certain frequencies within the sound signal. Generally, frequencies approaching the resonant frequency of a sound signal are heard more clearly, while those frequencies that are further away from the resonant frequency of a sound signal are more subtle or inaudible.

The resonant frequency can be changed by changing the total capacitance (26+36+28), which is the sum of the cable capacitance 36, pickup capacitance 26 and the added capacitance 28. The cable capacitance 36 is a function of the cable's capacitance per foot rating and the cable's length. As such, the cable capacitance is essentially fixed for a given cable of a given length. In the present invention, by changing the added capacitance 28, the total capacitance (26+36+28) can be changed, which yields a change in the resonant frequency of the sound signal, thereby changing the tonality of the sound produced.

Figure 3:
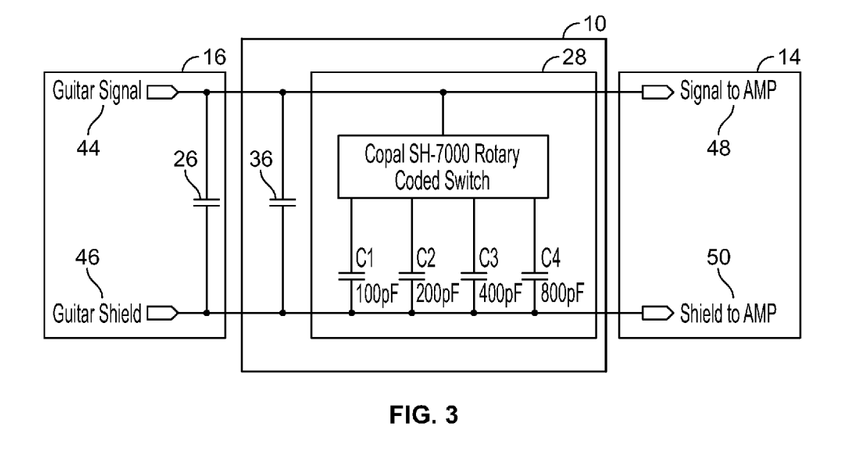
FIG. 3 is a circuit diagram showing a capacitance switching circuit for use with an instrument cable having adjustable capacitance, in accordance with an embodiment of the present invention.

The added capacitance 28 is selected from a plurality of capacitances by using the variable capacitance circuit shown in FIG. 3. In FIG. 3, a rotary binary coded switch 52 is used to select the added capacitance 28. When the instrument is played, a sound signal is received from the guitar pickup 16 at the input 44. The sound signal is then passed through the cable, where the tonality of the sound signal is affected by the cable capacitance 36 and the added capacitance 28. The capacitance-affected sound signal is then output to the amplifier 14 at the output 48. The shields 46 and 50 provide grounding for the sound signal so as to prevent interference from outside sources.

The added, and thus, total, capacitance can be changed using a suitable switching circuit, and may be accomplished using a rotary binary coded switch, a combination of individual switches, a combination of transistors, a combination of buttons, or another combination of elements that allows for varying the capacitance by adding individual capacitors or combinations of capacitors in parallel. In the embodiment shown in FIG. 3, the rotary binary coded switch 52 allows the user to adjust the added capacitance 28 in 100 pF increments from 0 pF to 1500 pF by selecting different combinations of the capacitances of the four capacitors C1, C2, C3 and C4. For example, if the user wishes to have an added capacitance 28 of zero, then the switch 52 is set to the setting in which none of the capacitors are selected, and the added capacitance 28 acts as an open circuit having effectively zero capacitance. If the user wishes to have an added capacitance 28 of 100 pF, then the switch 52 is set to select only capacitor C1. If the user wishes to have an added capacitance 28 of 200 pF, then the switch 52 is set to select only capacitor C2. If the user wishes to have an added capacitance of 300 pF, then the switch is set to select both capacitors C1 and C2. In the embodiment shown in FIG. 3, the switch 52 can have up to 16 different settings, each setting corresponding to a different combination of the capacitors C1-C4, allowing the user to adjust the added capacitance 28 in 100 pF increments from 0 pF to 1500 pF. In this embodiment, the four capacitance values C1-C4 have been specifically selected (100 pF, 200 pF, 400 pF, and 800 pF) so that every 100 pF value from 0 pF to 1500 pF is possible. Being able to increase the capacitance in 100 pF increments allows for finer resolution in the tonal adjustment. This capacitance range was selected because, in certain applications, the ability to vary the capacitance from 0 pF to 1500 pF permits the most dramatic variation in tone. The different combinations and capacitance values are detailed in Table 1.

TABLE 1

Capacitor Value Combinations

| Capacitors Selected | Added Capacitance | Rotary Switch Position |
|---|---|---|
| None | 0 pF | 0 |
| C1 | 100 pF | 1 |
| C2 | 200 pF | 2 |
| C1 + C2 | 300 pF | 3 |
| C3 | 400 pF | 4 |
| C1 + C3 | 500 pF | 5 |
| C2 + C3 | 600 pF | 6 |
| C1 + C2 + C3 | 700 pF | 7 |
| C4 | 800 pF | 8 |
| C1 + C4 | 900 pF | 9 |
| C2 + C4 | 1000 pF | A |
| C1 + C2 + C4 | 1100 pF | B |
| C3 + C4 | 1200 pF | C |
| C1 + C3 + C4 | 1300 pF | D |
| C2 + C3 + C4 | 1400 pF | E |
| C1 + C2 + C3 + C4 | 1500 pF | F |

Although the embodiment of FIG. 3 shows only four capacitors C1-C4, greater or fewer numbers of capacitors are possible. In one embodiment, for "n" total capacitors connected to the switch 52, there are $2^n$ possible capacitance values that may be selected by a user for the added capacitance 28. In FIG. 3, there are 4 capacitors connected to the switch 52, so there are 16 possible capacitance values. If the circuit had 5 different capacitors connected to the switch 52, then there would be 32 possible capacitance values. If the circuit had only 3 different capacitors connected to the switch 52, then there would be only 8 possible capacitance values. If there is not an option for a 0 pF added capacitance 28, then there would be $2^n-1$ possible capacitance values.

In embodiments for which the added capacitance 28 can be set to zero, the minimum total capacitance is determined by cable capacitance 36 combined with the pickup capacitance (26+36), which is a result of the type and length of the cable being used and the pickup being used. In one embodiment, a lower capacitance cable of a shorter length is used because it places the range of adjustment in an area that offers a more musical range of tonal choices. One example of such a cable is the Belden cable 8255 standard coax cable.

Figure 4:
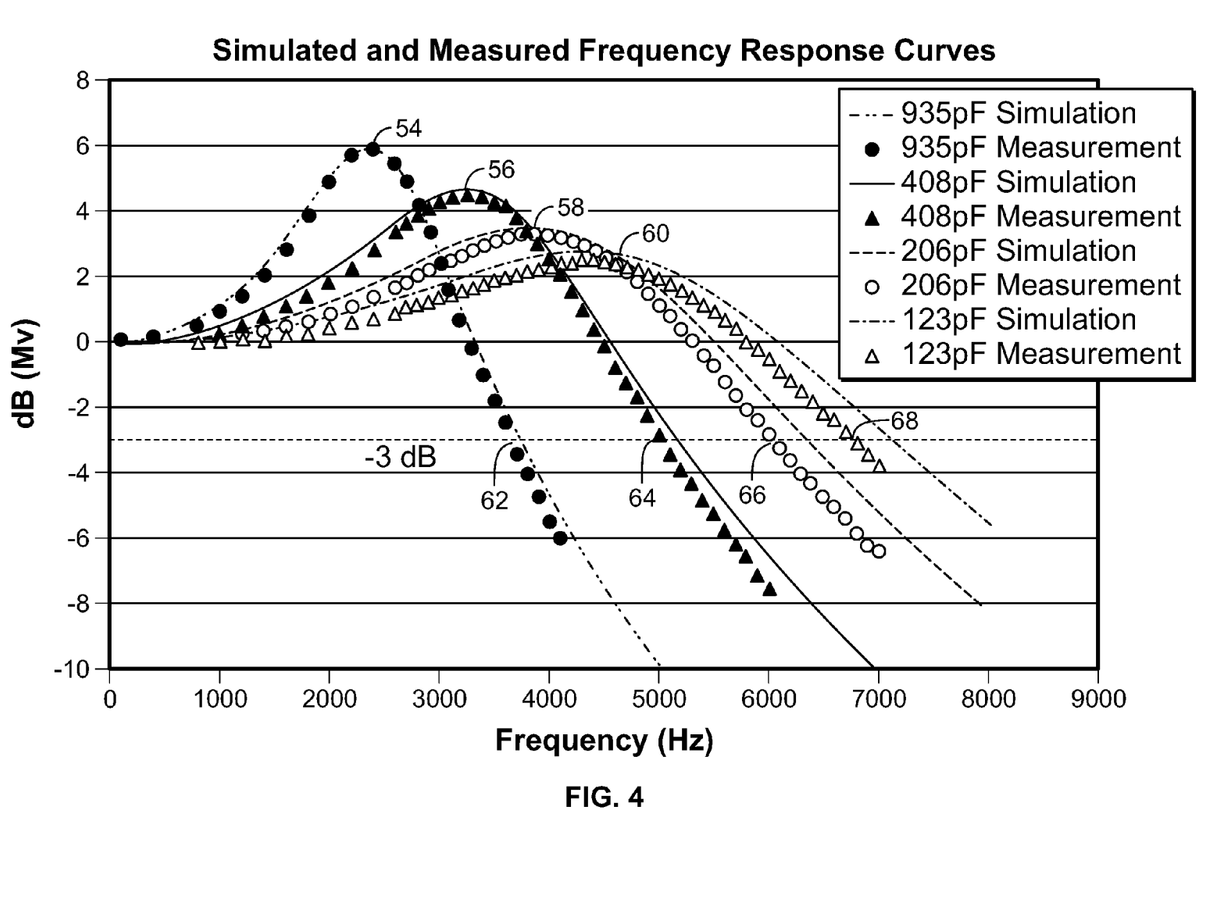
FIG. 4 is a response curve chart for a cable at different capacitances, in accordance with an embodiment of the present invention.

With reference to FIG. 4, there is shown a measurement chart showing response curves for different total capacitances (26+36+28). The resonant frequencies for the four curves are represented by the points 54, 56, 58 and 60, and roll-off points are represented by the points 62, 64, 66 and 68. The response curves shown in FIG. 4 demonstrate that the amplitude of the resonant frequency is decreased and the frequency of the resonant frequency is increased as the total capacitance (26+36+28) is decreased, thereby causing a variation in tone. A higher total capacitance (26+36+28) yields a tonality in which a smaller range of lower frequencies is emphasized, while a lower total capacitance (26+36+28) yields a tonality in which a larger range of higher frequencies is highlighted. Additionally, the frequency at which the response curve begins to roll off also changes as a result of changes to the total capacitance (26+36+28). Generally, frequencies at which the amplitude is below the roll-off point will not be heard in the sound signal. For a given pickup inductance, as the total capacitance (26+36+28) decreases, the roll off point will increase, leading to a greater range of frequencies being heard in the sound signal. As the total capacitance (26+36+28) increases, the roll off point decreases and yields a smaller, more focused range of frequencies being heard.

Figure 5A:
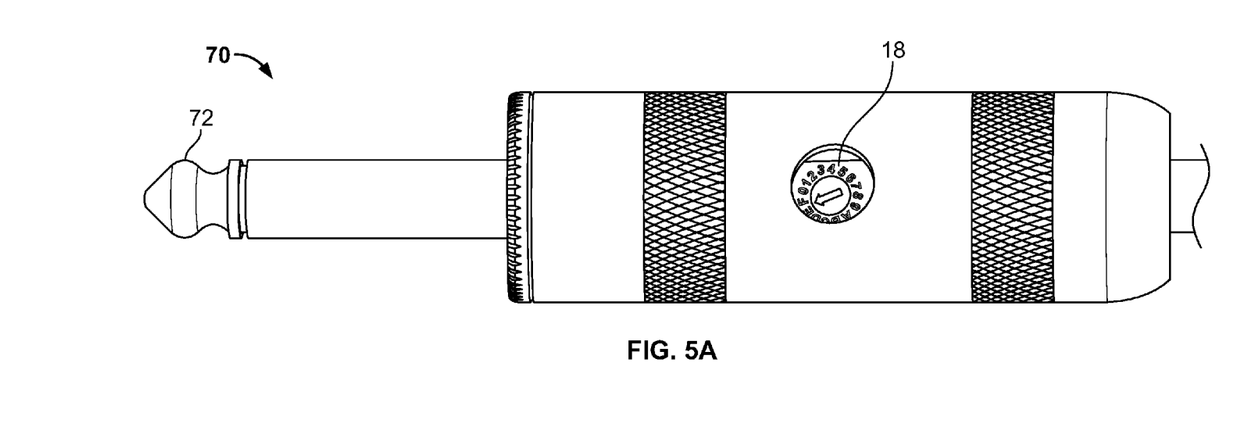
FIG. 5A is a side elevation view of a cable connector, in accordance with an embodiment of the present invention.
Figure 5B:
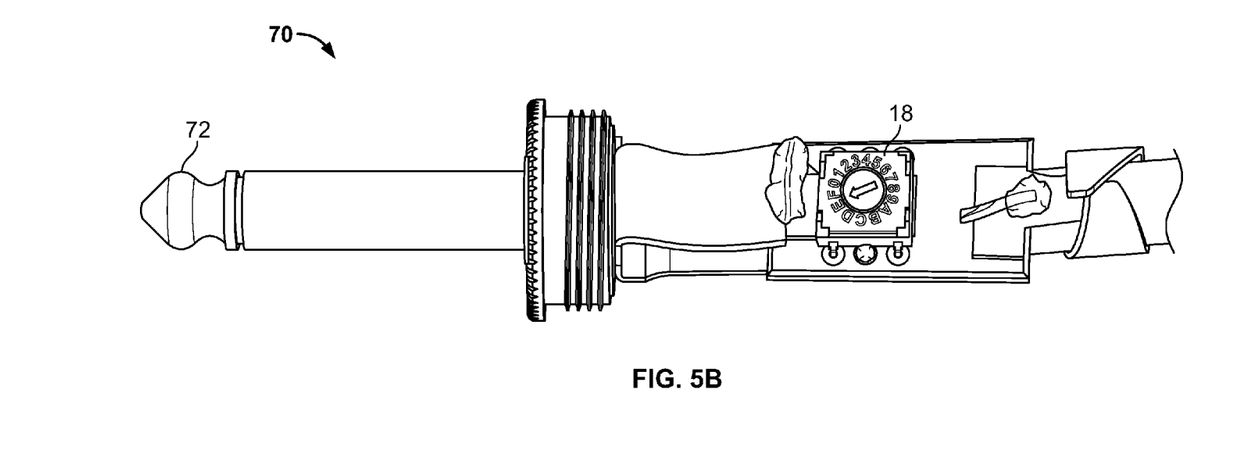
FIG. 5B is an internal view of the cable connector of FIG. 5A.

With reference to FIGS. 5A and 5B, there is shown cable connector 70 containing a variable capacitance circuit, in accordance with an embodiment of the present invention. The added capacitance 28 is selected by using the rotary switch 18. The cable connector 70 has a cable end portion 72, which can be a ¼" male connector. The cable end portion 72 is sized and shaped to plug into an instrument and receive an electrical sound signal. The sound signal passes from the cable end portion 72 to the main body of the cable connector 70, where the sound signal is subjected to an adjustable capacitance that varies the tonality of the sound. The user can rotate the rotary switch 18 to select one of a plurality of possible capacitance values. In one embodiment, the rotary switch 18 has 16 setting options, allowing the user to select from 16 different capacitance values. The rotary switch may be rotated using a small screwdriver-like tool.

Figure 6A:
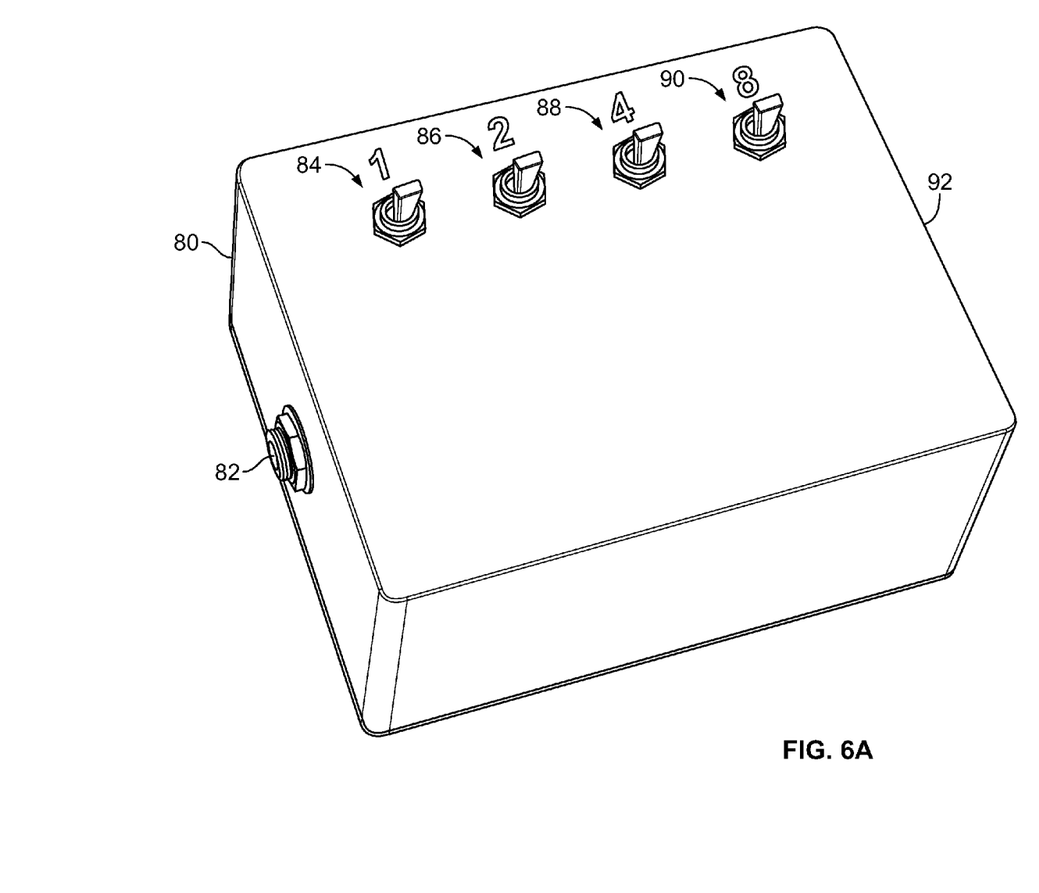
FIG. 6A is a perspective view of an external capacitance switch for use with an instrument cable, in accordance with an embodiment of the present invention.
Figure 6B:
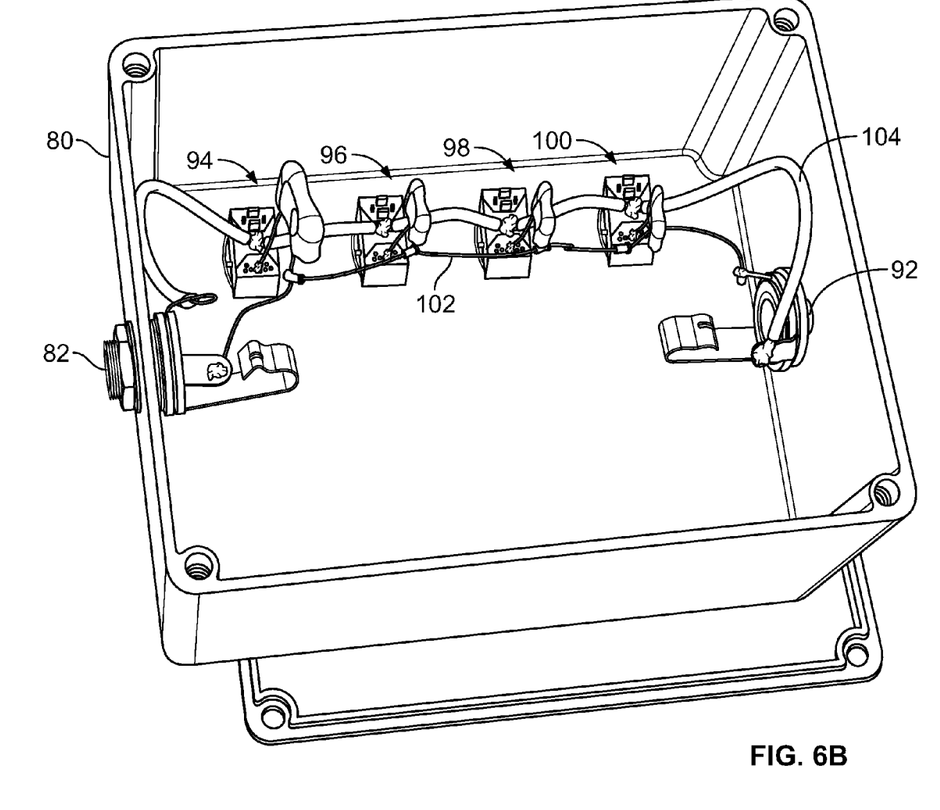
FIG. 6B is an internal view of the external capacitance switch of FIG. 6A.

FIG. 6A depicts another embodiment of the present invention. In FIG. 6A, the variable capacitance circuitry is housed in a box 80 that is separate from the instrument cable 10. FIG. 6B is a view of the inside of the variable capacitance box 80 of FIG. 6A. The male cable end portion 72 of the instrument cable 10 engages the box 80 at the female connector 82. Four switches 84, 86, 88 and 90 allow the user to select the added capacitance 28. Each of the four switches 84, 86, 88 and 90 connects or disconnects one of four capacitors 94, 96, 98 or 100. Different combinations of the four switches 84, 86, 88 and 90 create different combinations of the four capacitors 94, 96, 98 and 100, thus creating 16 different added capacitance values 28 for the user to select from. The output connector 92 allows the box 80 to be connected to an amplifier, which amplifies the sound signal from the instrument.

Each of the four capacitors 94, 96, 98 and 100 is connected on one end to the ground/shield wire 102, and on the other end to one of the four switches 84, 86, 88 or 90. The input 82, the output 92, and the four switches 84, 86, 88 and 90 are connected by the wire 104, which carries the sound signal. When all four switches 84, 86, 88 and 90 are turned off, none of the capacitors are connected to the sound signal in the wire 104. In this configuration, the sound signal passes through the wire 104 with no capacitance added by the variable capacitance circuit. When any of the four switches 84, 86, 88 and 90 is turned on, the switches that are turned on connect their respective capacitors to the sound signal wire 104, thereby adding those capacitances to the circuit. For example, turning on only switch 84 connects only capacitor 94, and turning on switches 86 and 90 connects capacitors 96 and 100. By using the different combinations of switches available, the user is able to select from $2^n$ possible capacitance values for "n" different switches and capacitors. In FIGS. 6A and 6B, there are 16 possible capacitance values that may be selected.

Although the invention has been disclosed with reference only to the presently preferred embodiments, those of ordinary skill in the art will appreciate that various modifications can be made without departing from the invention. Accordingly, the invention is defined only by the following claims.

What is claimed is:

1. A two conductor cable connector for an audio cable comprising:
 a signal conductor;
 a ground conductor;
 a switch; and
 a plurality of capacitors, the plurality of capacitors and switch being arranged to form a variable capacitance circuit in which the switch can selectively couple and uncouple one or more of the plurality of capacitors in parallel between the signal conductor and ground conductor, and the capacitance of which depends on which of the plurality of capacitors arc selectively coupled in parallel between the signal conductor and ground conductor by the switch; wherein:
 the connector has an overall capacitance which includes (i) its inherent capacitance between the signal conductor and ground conductor, and (ii) any additional capacitance that is selectively added by the variable capacitance circuit;
 switching among the capacitors in the variable capacitance circuit with the switch selectively changes the overall capacitance of the connector;
 the signal conductor is configured to receive an input signal corresponding to a sound; and
 the sound has a tonality that can be altered by changing the overall capacitance of the connector by adjusting the capacitance of variable capacitance circuit with the switch.

2. The cable connector of claim 1, wherein the cable connector is configured to connect to an instrument cable.

3. The cable connector of claim 1, wherein the switch is a rotary coded switch.

4. The cable connector of claim 1, wherein the switch comprises a plurality of individual switches.

5. The cable connector of claim 1, wherein:
 there are "n" number of capacitors; and
 the switch is configured so that the overall capacitance of the connector can be changed to one of $2^n$ possible capacitances by switching among the capacitors using the switch.

6. The cable connector of claim 1, wherein:
 there are four capacitors; and
 the switch and four capacitors are configured so that the additional capacitance added to the connector by the variable capacitance circuit can be changed to one of sixteen possible capacitances ranging from approximately 0 pF to approximately 1500 pF by switching among the capacitors using the switch.

7. The cable connector of claim 1, wherein
 there are "n" number of capacitors; and
 the switch is configured so that the overall capacitance of the connector can be changed to one of $2^n-1$ possible capacitances by switching among the capacitors using the switch.

8. A two conductor audio cable comprising:
 an input connector;
 a signal conductor coupled to a signal terminal in the input connector;
 a ground conductor coupled to a ground terminal in the input connector;
 a switch; and
 a plurality of capacitors, the plurality of capacitors and switch being arranged to form a variable capacitance circuit in which the switch can selectively couple one or more of the plurality of capacitors in parallel between the signal conductor and ground conductor, and the capacitance of which is adjustable based on which of the plurality of capacitors arc selectively coupled in parallel between the signal conductor and around conductor by the switch; wherein
 the cable has a capacitance which includes (i) its inherent capacitance between the signal conductor and ground conductor, and (ii) any additional capacitance that is selectively added by the variable capacitance circuit;
 the signal terminal of the input connector is configured to receive an input signal corresponding to a sound; and
 the sound has a tonality that can be altered by changing the capacitance of the cable by adjusting the capacitance of variable capacitance circuit with the switch.

9. The cable of claim 8, wherein the switch is a rotary coded switch.

10. The cable of claim 8, wherein the switch comprises a plurality of individual switches.

11. The cable of claim 8, wherein:
 there are "n" number of capacitors; and
 the switch is configured so that the capacitance of the cable can be changed to one of $2^n$ possible capacitances by switching among the capacitors using the switch.

12. The cable of claim 8, wherein:

there are four capacitors; and the switch and four capacitors are configured so that the additional capacitance added to the cable by the variable capacitance circuit can be changed to one of sixteen possible capacitances ranging from approximately 0 pF to approximately 1500 pF by switching among the capacitors using the switch.

13. The cable of claim 8, wherein:

there are "n" number of capacitors; and the switch is configured so that the capacitance of the cable can be changed to one of $2^n-1$ possible capacitances by switching among the capacitors using the switch.

14. A method for transmitting a sound signal, the method comprising:

selecting one of a plurality of capacitance options using a switch of a variable capacitance circuit in which the switch and a plurality of capacitors are arranged such that the switch can selectively couple and uncouple one or more of the plurality of capacitors in parallel between a signal conductor and a ground conductor of an audio cable, wherein the capacitance of the variable capacitance circuit is adjustable based on which of the plurality of capacitors are selectively coupled in parallel between the signal conductor and ground conductor by the switch;

receiving a signal on the signal conductor corresponding to a sound having a tonality; and altering the tonality of the sound by applying a selected one of the plurality of capacitance options.

15. The method of claim 14, wherein the switch is a rotary coded switch.

16. The method of claim 14, wherein the switch comprises a plurality of individual switches.

17. The method of claim 14, wherein:

there are "n" number of capacitors; and the switch is configured so that the user may select from one of $2^n$ possible capacitances by switching among the capacitors using the switch.

18. The method of claim 14, wherein:

there are four capacitors; and the switch and four capacitors are configured so that the user may select from one of sixteen possible additional capacitances to be added by the variable capacitance circuit ranging from approximately 0 pF to approximately 1500 pF by switching among the capacitors using the switch.

19. The method of claim 14: wherein:

there are "n" number of capacitors; and the switch is configured so that the user may select from one of $2^n-1$ possible capacitances by switching among the capacitors using the switch.

20. A two conductor cable comprising:

an input connector;

a signal conductor coupled to a signal terminal in the input connector;

a ground conductor coupled to a around terminal in the input connector;

a rotary coded switch; and four capacitors, the four capacitors and rotary coded switch being arranged to form a variable capacitance circuit in which rotation of the rotary coded switch selectively couples one or more of the four capacitors in parallel between the signal conductor and ground conductor, and the capacitance of which is adjustable based on which of the four capacitors are selectively coupled in parallel between the signal conductor and ground conductor by the rotary coded switch; wherein the cable has a capacitance which includes (i) its inherent capacitance between the signal conductor and ground conductor, and (ii) any additional capacitance that is selectively added by the variable capacitance circuit;

the signal terminal of the input connector is configured to receive an input signal corresponding to a sound;

the sound has a tonality that can be altered by changing the capacitance of the cable by adjusting the capacitance of variable capacitance circuit with the switch; and the switch is configured so that the additional capacitance added to the cable by the variable capacitance circuit can be changed to one of sixteen possible capacitances ranging from approximately 0 pF to approximately 1500 pF by switching among the capacitors using the switch.

* * * * *